(12) United States Patent
Lim et al.

(10) Patent No.: US 8,633,078 B2
(45) Date of Patent: Jan. 21, 2014

(54) METHOD FOR MANUFACTURING SEMICONDUCTOR DEVICE

(75) Inventors: Kwan-Yong Lim, Seongnam-si (KR); Chung-Geun Koh, Seoul (KR); Sang-Bom Kang, Seoul (KR); Ui-Hui Kwon, Hwaseong-si (KR); Hyun-Jung Lee, Suwon-si (KR); Tae-Ouk Kwon, Hwaseong-si (KR); Seok-Hoon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 13/240,470

(22) Filed: Sep. 22, 2011

(65) Prior Publication Data
US 2012/0108023 A1    May 3, 2012

(30) Foreign Application Priority Data
Oct. 28, 2010 (KR) ........................ 10-2010-0106302

(51) Int. Cl.
*H01L 21/336* (2006.01)

(52) U.S. Cl.
USPC .................... 438/286; 438/938; 257/E21.618

(58) Field of Classification Search
USPC .......................................... 438/407, 910, 938
See application file for complete search history.

(56) References Cited

U.S. PATENT DOCUMENTS

| | | | |
|---|---|---|---|
| 5,675,166 A * | 10/1997 | Ilderem et al. | 257/345 |
| 7,410,876 B1 | 8/2008 | Min et al. | |
| 2009/0130817 A1 * | 5/2009 | Pinto et al. | 438/424 |
| 2009/0298249 A1 | 12/2009 | Hoentschel et al. | |

FOREIGN PATENT DOCUMENTS

JP    5-47794    2/1993

* cited by examiner

*Primary Examiner* — Chandra Chaudhari
(74) *Attorney, Agent, or Firm* — Onello & Mello, LLP

(57) ABSTRACT

A semiconductor device is formed with a gate pattern formed on a substrate, and a recrystallized region having a stacking fault defect in the substrate at one side of the gate pattern. The semiconductor device can have a reduced leakage current and improved channel conductivity.

14 Claims, 6 Drawing Sheets

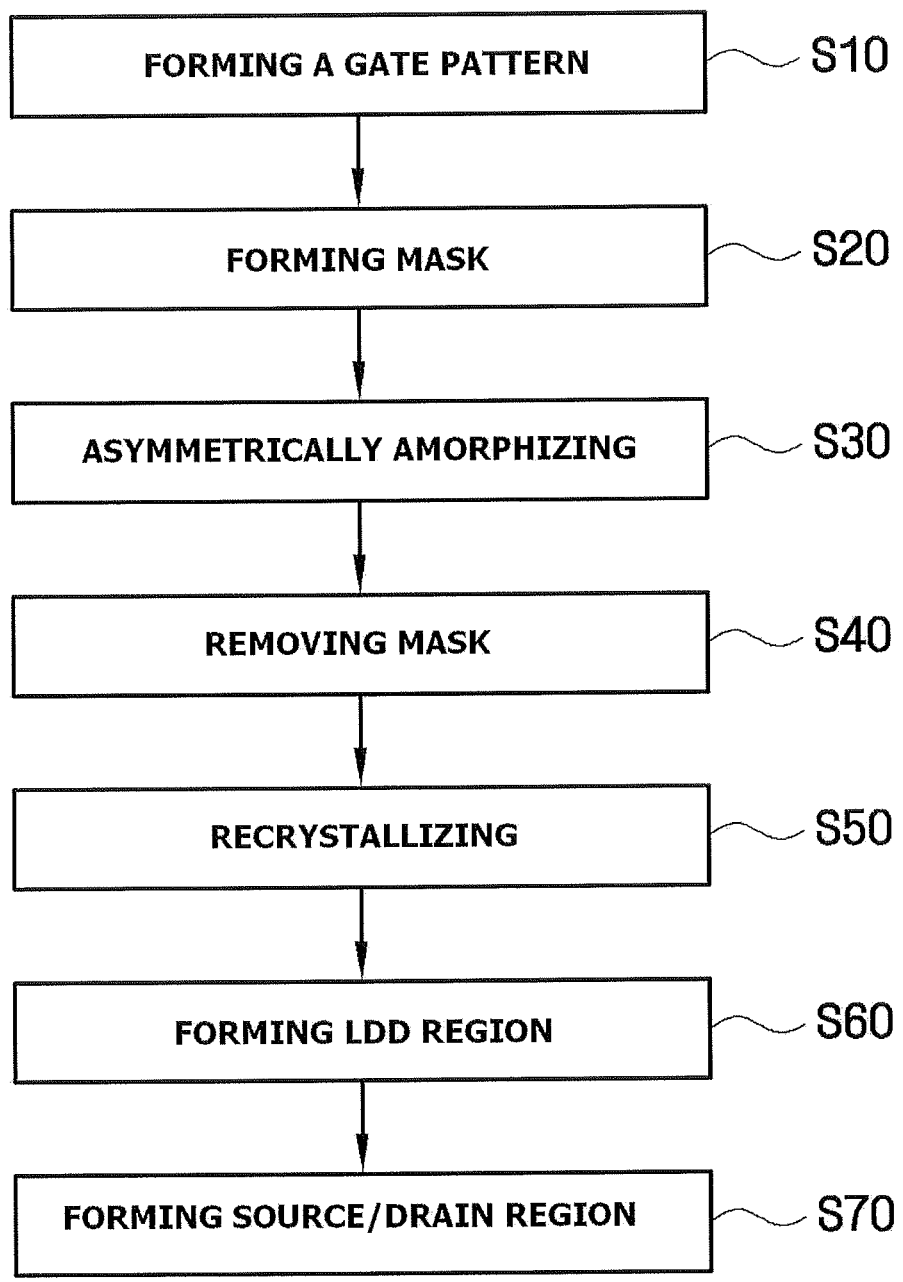

METHOD FOR MANUFACTURING SEMICONDUCTOR DEVICE

CROSS-REFERENCE TO RELATED APPLICATION

This application claims priority from Korean Patent Application No. 10-2010-0106302 filed on Oct. 28, 2010 in the Korean Intellectual Property Office, and all the benefits accruing therefrom under 35 U.S.C. 119; the entire contents of this priority application are herein incorporated by reference.

BACKGROUND OF THE INVENTION

1. Field of the Invention

The present invention relates to a semiconductor device and a method for manufacturing the same, and more particularly to a semiconductor device having a reduced leakage current and improved channel conductivity, and a method for manufacturing the semiconductor device.

2. Description of the Related Art

Research is under way to increase the operation speed and packing density of semiconductor devices. A semiconductor increases discrete devices such as a metal oxide semiconductor (MOS) transistor. As an integration degree of the semiconductor device is increased, scaling down a gate of the MOS transistor is becoming a major challenge. In addition, a channel region located under the gate becomes shorter.

Accordingly, various methods are investigated to enhance channel conductivity by increasing the mobility of carriers in a channel region with respect to a predetermined channel length. One mechanism for increasing the mobility of carriers is to induce compressive stress to a channel region to thereby increase hole mobility in the channel, while inducing tensile stress to the channel region to improve electron mobility in the channel region.

The stress memorization technique (SMT) is one technique that has recently been used to induce stress to a channel, which may, however, result in an increase of leakage current.

SUMMARY OF THE INVENTION

Embodiments of the present invention include a semiconductor device having a reduced leakage current and improved channel conductivity, as well as a method for manufacturing a semiconductor device having a reduced leakage current and improved channel conductivity.

According to an aspect of the present invention, a semiconductor device including a gate pattern is formed on a substrate, and a recrystallized region having a stacking fault defect in the substrate is formed at one side of the gate pattern.

According to another aspect of the present invention, a method for manufacturing a semiconductor device includes forming a gate pattern on a substrate, forming a mask on the substrate at one side of the gate pattern, forming an amorphous region by implanting impurities into the substrate, removing the mask, and forming a recrystallized region by forming a stress liner on the substrate to cover the gate pattern and crystallizing the amorphous region.

As described above, the mobility of carriers can be enhanced by increasing stress applied to a channel. In addition, the mobility of carriers can be more effectively enhanced by inducing more stress from a source region than from a drain region. Further, characteristics of the semiconductor device can be more enhanced by reducing a leakage current generated in the drain region.

BRIEF DESCRIPTION OF THE DRAWINGS

The above and other features and advantages of the present invention will become more apparent by describing in detail embodiments thereof with reference to the attached drawings in which:

FIG. 2 is a flow chart showing process steps of a method for manufacturing a semiconductor device according to an embodiment of the present invention.

DETAILED DESCRIPTION

Figure 1:
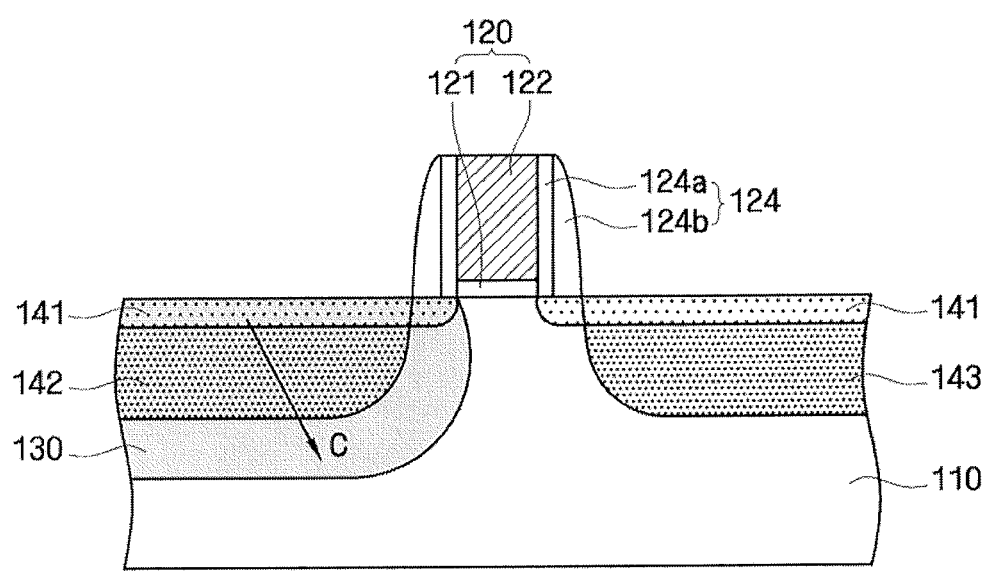
FIG. 1 is a cross-sectional view of a semiconductor device according to an embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "on" or "connected to" another element or layer, it can be directly on or connected to the other element or layer, or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like numbers refer to like elements throughout.

As used herein, the singular forms, "a", "an" and "the," are intended to include the plural forms as well, unless the context clearly indicates otherwise.

It will be further understood that the terms, "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties; and shapes of regions shown in figures are exemplary and are not intended to limit aspects of the invention.

Hereinafter, a semiconductor device according to an embodiment of the present invention will be described with reference to FIG. 1, which provides a cross-sectional view of the semiconductor device.

Referring to FIG. 1, the semiconductor device may include a gate pattern 120, a recrystallized region 130, a source region 142 and a drain region 143. The semiconductor device may further include a gate spacer 124 and a lightly doped drain (LDD) region 141.

The gate pattern 120 is formed on a substrate 110, and a channel region is formed under the gate pattern 120 to allow a current to flow therethrough.

The substrate 110 may be a rigid substrate, such as a silicon substrate, a silicon-on-insulator (SOI) substrate, a gallium arsenic substrate, a silicon germanium substrate, a ceramic substrate, a quartz substrate, and a display glass substrate. Alternatively, the substrate 110 may be a flexible plastic substrate made of, for example, polyimide, polyester, polycarbonate (PC), polyethersulfone (PES), polymethyl methacrylate (PMMA), or polyethylene naphthalate (PEN), polyethylene terephthalate (PET).

The gate pattern 120 may include a gate insulating layer 121 and a gate electrode 122. Although not shown in FIG. 1, a hard mask layer that protects the gate electrode 122 may be formed on the gate electrode 122. The hard mask layer may be formed of silicon nitride ($Si_3N_4$) or silicon oxynitride (SiON), but is not limited thereto.

The gate insulating layer 121 may include a silicon oxide (e.g., $SiO_2$) layer, a silicon nitride (e.g., $Si_3N_4$) layer, SiON, $Ge_xO_yN_z$, $Ge_xSi_yO_z$, a high-k dielectric material or a combination thereof, or a stacked layer having these materials sequentially stacked. Here, the high-k dielectric material may include, but not limited to, $HfO_2$, $ZrO_2$, $Al_2O_3$, $Ta_2O_5$, hafnium silicate, zirconium silicate, a combination thereof.

The gate electrode 122 may be formed of, but not limited to, a single layer of poly-Si, poly-SiGe, doped poly-Si, a metal such as Ta, TaN, TaSiN, TiN, Mo, Ru, Ni, or NiSi, or a metal silicide, or a stacked layer having these materials sequentially stacked. In a case where the gate electrode 122 is formed of a metal or a metal silicide, low resistance can be realized with a fine line width, and doping impurities are not necessary.

The gate spacer 124 is formed on sidewalls of the gate pattern 120 and protects the gate electrode 122. The gate spacer 124 may have a single-layered structure formed of silicon nitride or a silicon oxide or a multilayered structure including a combination of a silicon nitride layer and a silicon oxide layer. FIG. 1 illustrates that the gate spacer 124 includes a first spacer 124a and a second spacer 124b. In detail, the first spacer 124a may be formed of a silicon oxide layer, and the second spacer 124b may be formed of a silicon nitride layer.

The recrystallized region 130 is formed at one side of the substrate 110 in view of the gate pattern 120. That is to say, the recrystallized region 130 is asymmetrically formed only at one side of the substrate 110 in view of the gate pattern 120. The recrystallized region 130 applies tensile stress or compressive stress to the channel region to thereby enhance carrier mobility in the channel region.

The recrystallized region 130 has a stacking fault defect. The stacking fault defect may occur when locations of atomic layers are changed or part of a continuous layer is added or removed due to stress applied to an amorphous region in the course of recrystallizing the amorphous region. Due to the stacking fault defect, the stress applied by recrystallizing is retained at a recrystallized lattice even after the stress is eliminated, and compressive stress or tensile stress is applied to the channel region. As shown in FIG. 1, the stacking fault defect may be formed such that it becomes closer to the gate pattern 120 (that is, in a direction indicated by an arrow 'C') downwardly in the substrate 110.

The closer to the channel region the stacking fault defect is formed, the more effectively the stress is applied to the channel region.

The LDD region 141 is formed by implanting low concentration impurity ions into the substrate on opposite sides of the gate pattern 120. The LDD region 141 relaxes electric fields in the source region 142 and the drain region 143 and reduces leakage current.

The impurities may be implanted by an ion implantation process. For example, n-type impurities (e.g., P, As, or the like) may be implanted for a negative metal oxide semiconductor (NMOS) device; and p-type impurities (e.g., B, $BF_2$, Ga, or the like), may be implanted for a positive metal oxide semiconductor (PMOS) device.

A portion of the LDD region 141 on the source region 142 is formed in the recrystallized region 130, which is formed in the substrate 110 on one side of the gate pattern 120

The source region 142 and the drain region 143 are spaced apart from each other in view of the gate pattern 120 and the gate spacer 124, and are formed by implanting heavily doped impurities using the gate pattern 120 and the gate spacer 124 as masks. For an NMOS region, an n-type dopant such as phosphorus (P) or arsenic (As) may be implanted; and for a PMOS region, a p-type dopant such as boron (B) or gallium (Ga) may be implanted.

The source region 142 or the drain region 143 may be formed in the recrystallized region 130. The source region 142 formed in the recrystallized region 130 may have a stacking fault defect. The drain region 143 is spaced apart from and faces the source region 142 in view of the gate pattern 120 while having no stacking fault defect.

In a case where the source region 142 or the drain region 143 is formed in the recrystallized region 130 having compressive stress or tensile stress retained in a lattice structure, the mobility of carriers can be enhanced by applying stress to the channel region. However, an end-of-range (EOR) defect may be generated around an amorphous region in the course of amorphizing the substrate 110 before crystallization, and gate-induced drain leakage (GIDL) may occur to the drain region 143. The EOR defect may increase the GIDL. In embodiments of the semiconductor device, the source region 142 with a stacking fault defect can enhance the carrier mobility by increasing the stress applied to the channel region, while the drain region 143 without a stacking fault defect can reduce leakage current.

Each of the source region 142 and the drain region 143 may have an elevated structure raised from the substrate 110. The elevated source and drain structures may have shallow junction structures (with a projected range, $R_p$) formed on a top surface of the substrate 10 by injecting impurities. Accordingly, undesired degradation of the device characteristics due to a short channel effect can be overcome.

Next, a method for manufacturing a semiconductor device according to an embodiment of the present invention will be described with reference to FIGS. 2 and 3A to 3H. FIG. 2 is a flow chart showing the process steps of a method for manufacturing a semiconductor device according to an embodiment of the present invention, and FIGS. 3A to 3H are cross-sectional views of the semiconductor device being manufactured with the process steps of FIG. 2.

Referring to FIG. 2, a method for manufacturing the semiconductor device may include forming a gate pattern (step S10), forming a mask (step S20), asymmetrically amorphizing (step S30), removing the mask (step S40) and recrystallizing (step S50). The method for manufacturing the semiconductor device may further include forming an LDD region (step S60) and forming source and drain regions (step S70).

Figure 3A:
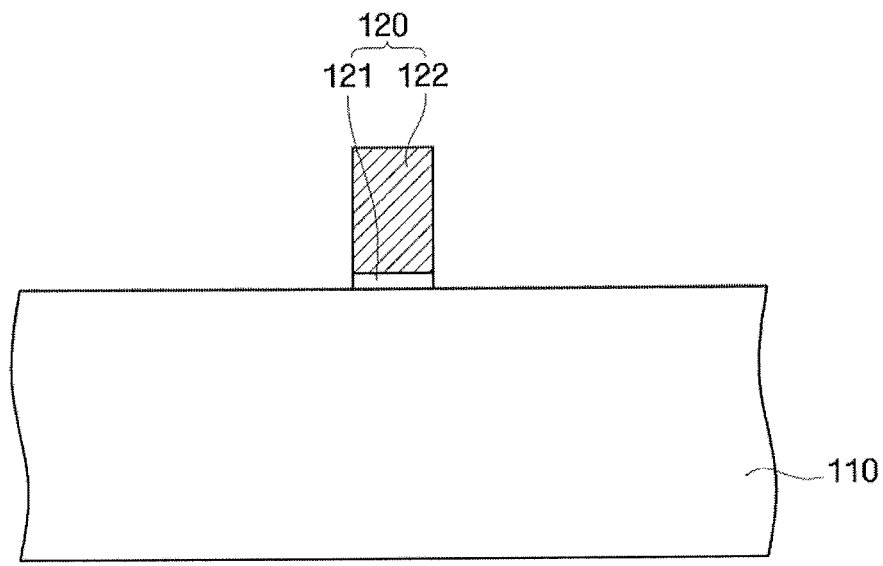
FIGS. 3A to 3H are cross-sectional views showing process steps of a method for manufacturing a semiconductor device according to an embodiment of the present invention.

Referring to FIG. 3A, the device is shown after step S10, when a gate pattern 120, including a gate insulating layer 121 and a gate electrode 122, is formed on a substrate 110.

In detail, an insulating layer for forming a gate insulating layer 121 and a layer for forming a gate electrode 122 are sequentially formed on the substrate 110 and patterned, thereby forming the gate pattern 120 having a stacked structure with the gate insulating layer 121 and the gate electrode 122 sequentially stacked.

Although a hard mask layer (not shown) may be formed on the gate electrode 122, it may be skipped as demanded by one skilled in the art. In order to protect the gate pattern 120, an insulating layer formed of a silicon oxide layer or a silicon nitride layer that is part of a gate spacer 124 may further be formed on sidewalls of the gate pattern 120.

Figure 3B:
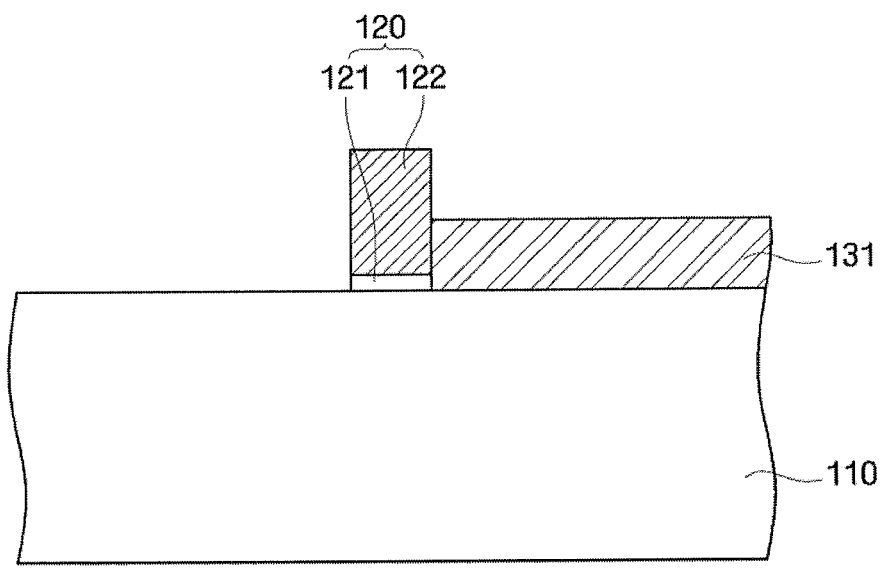

Referring to FIG. 3B, the device is shown after step S20, when a mask 131 is formed on the substrate 110 at one side of the gate pattern 120. The mask 131 prevents impurities from being implanted into the substrate 110 below the mask 131 and being amorphized.

In detail, a hard mask layer or a photoresist layer is deposited to cover either side of the substrate 110 at opposite sides of the gate pattern 120. The mask 131 is formed of a hard mask layer or a photoresist. The hard mask layer may be formed of an insulating layer, and the photoresist layer may be formed of any photoresist that is generally used in the art.

Figure 3C:
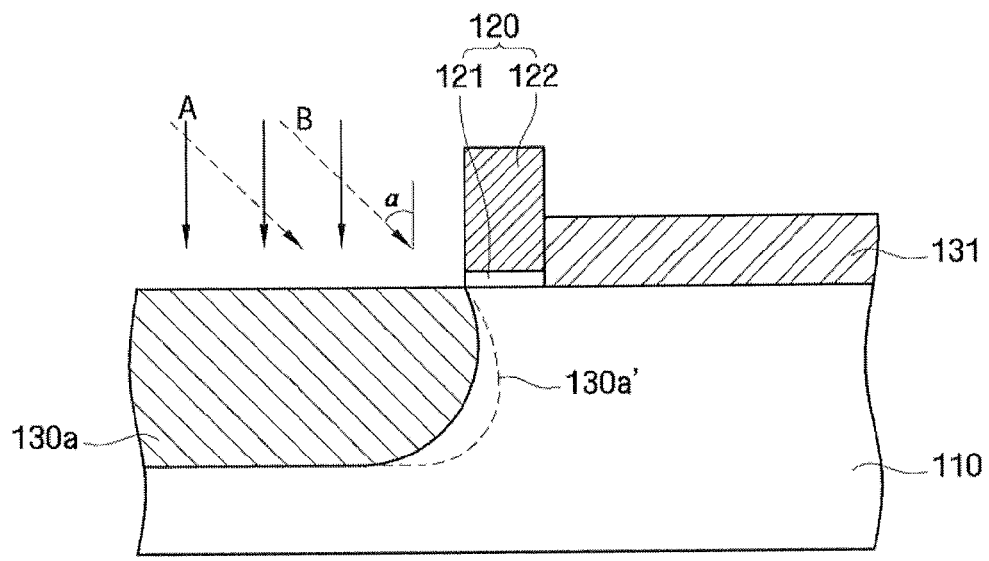

Referring to FIG. 3C, the device is shown in step S30, as an amorphous region 130a is formed by implanting impurities into the substrate 110.

In detail, if impurity ions are implanted on the substrate 110 using an ion implantation process, the impurity ions permeate into interstices of a crystal lattice, so that a crystalline region is changed into the amorphous region 130a. The ion implantation process may be performed by a generally known method, and non-limiting examples of the impurities may include Si, Ge, Sb, In, As, P, $BF_2$, Xe and Ar.

One side of the substrate 110 in view of the gate pattern 120 is covered by the mask 131. Thus, amorphization asymmetrically occurs only at a region of the substrate that is not covered by the mask 131.

During amorphization, the impurities may be implanted in a direction perpendicular to the substrate 110, as indicated by A (as shown, the impurities A are implanted in a direction perpendicular to the substantially planar exposed surface of the amorphous region 130a), or may be implanted at a predetermined angle ($\alpha$) of inclination, as indicated by B, with respect to the direction perpendicular to the substrate. In the latter case, an amorphous region 130a' is formed much closer to a channel region, thereby further enhancing stress applied to the channel region.

The predetermined angle ($\alpha$) may be in a range of 10 to 40 degrees, more particularly in a range of 20 to 30 degrees. When the predetermined angle ($\alpha$) is in a range of 10 to 40 degrees, the amorphous region 130a may be formed close to the channel region, and impurity ions may be implanted without interference considering a distance between gate patterns 120.

Figure 3D:
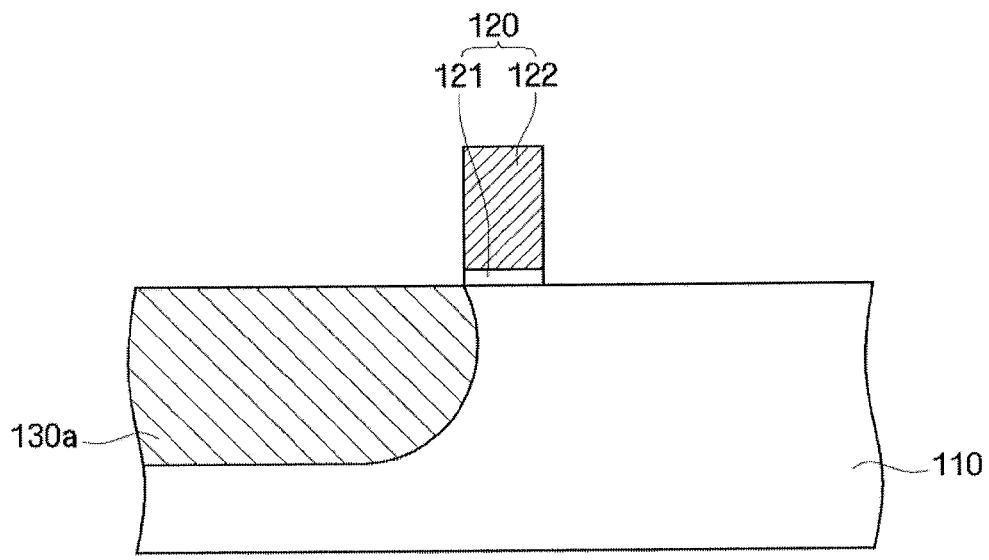

Referring to FIG. 3D, the device is shown after step S40, when the mask 131, which was formed on the substrate 110 only to one side of the gate pattern 120, is removed.

In detail, amorphization is performed only on the substrate 110 at one side of the gate pattern 120, where the mask 131 is not formed, by an ion implantation process, as discussed above; and the mask 131 is then removed. The mask 131 may be removed by ashing and cleaning.

Figure 3E:
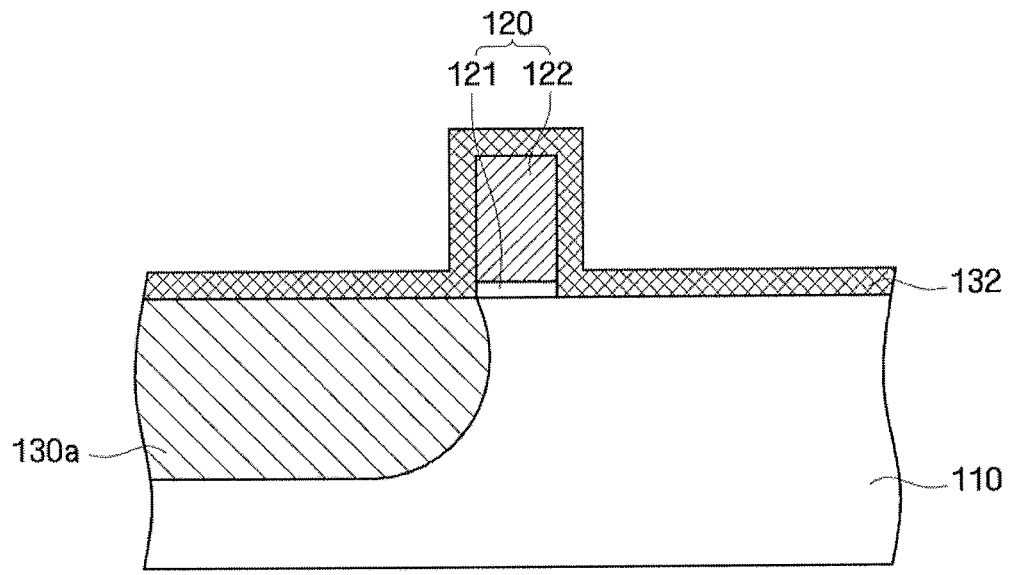
Figure 3F:
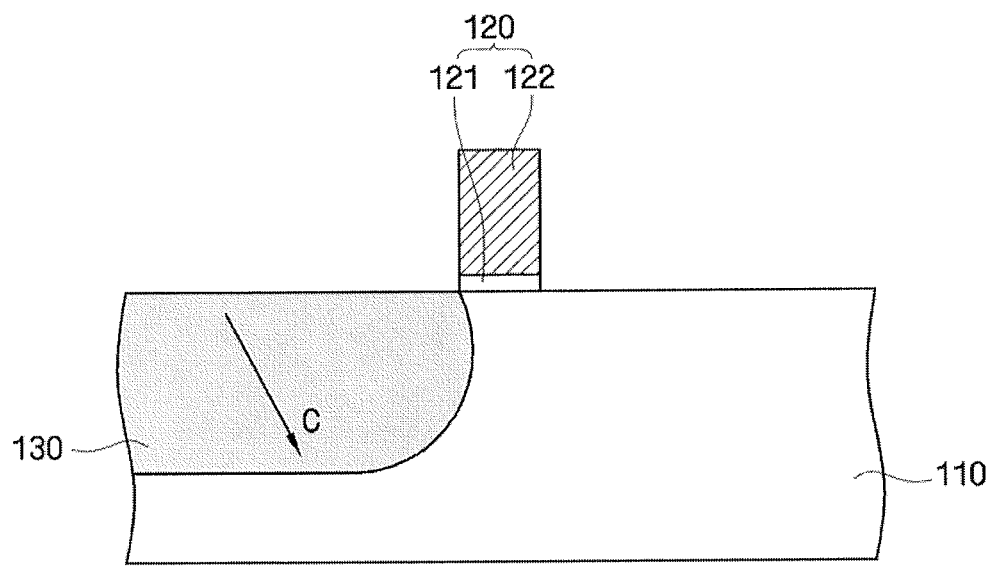

Referring to FIGS. 3E and 3F, the device is shown during step S50, when a stress liner 132 is formed on the entire surface of the substrate 110 to cover the gate pattern 120, and the amorphous region 130a is recrystallized to form a recrystallized region 130.

In detail, the stress liner 132 is deposited on the entire surface of the substrate 110 by chemical vapor deposition (CVD) to cover the gate pattern 120 and annealed, thereby recrystallizing the amorphous region 130a in the substrate 110 into a solid phase epitaxy.

In order to apply stress to the amorphous region 130a in the substrate 110, the stress liner 132 may be made of a material having a thermal expansion coefficient that differs from that of the material that forms the substrate 110. In a case where the channel region below the gate pattern 120 has p-type impurity ions, the stress liner 132 may be made of a material capable of applying tensile stress to the channel region. In a case where the channel region below the gate pattern 120 has n-type impurity ions, the stress liner 132 may be made of a material capable of applying compressive stress to the channel region. In detail, for an NMOS, for example, the stress liner 132 may be formed of a silicon nitride ($Si_xN_y$) layer using a low-pressure chemical vapor deposition (LPCVD) process. For a PMOS, the stress liner 132 may be formed of silicon carbide (SiC) using a plasma-enhanced chemical vapor deposition (PECVD) process.

The annealing may include, but is not limited to, spike annealing, rapid thermal annealing, and the like, which may be quickly performed.

As described above, the annealing performed in the presence of the stress liner 132 brings about crystallization to the solid phase epitaxy in the amorphous region 130a. A stacking fault defect may occur when part of a continuous layer is added or removed while crystals of the amorphous region 130a regrow. Accordingly, the stress applied to the amorphous region 130 by the stress liner 132 is retained in the recrystallized region 130 even after the stress liner 132 is eliminated, thereby applying stress to the channel region and increasing the channel conductivity.

The stacking fault defect is formed such that it becomes closer to the gate pattern (that is, in a direction indicated by an arrow 'C') downwardly in the substrate 110.

In addition, during the amorphization, if impurity ions are implanted at a predetermined angle of inclination such that some of the impurity ions extend under the gate pattern 120 (in the orientation shown) as impurity ions penetrate the substrate 110; consequently, the amorphous region is formed much closer to the channel region and the stacking fault defect is formed much closer to the channel region, thereby further enhancing stress applied to the channel region.

After the recrystallized region 130 having a stacking fault defect is formed, the stress liner 132 is completely removed by, for example, etching. In addition, before forming the stress liner 132, a silicon oxide layer (not shown) covering the entire surface of the substrate 110 may be formed. The silicon oxide layer may serve as an etch stop layer when etching the stress liner 132, and is also completely removed after recrystallization.

Figure 3G:
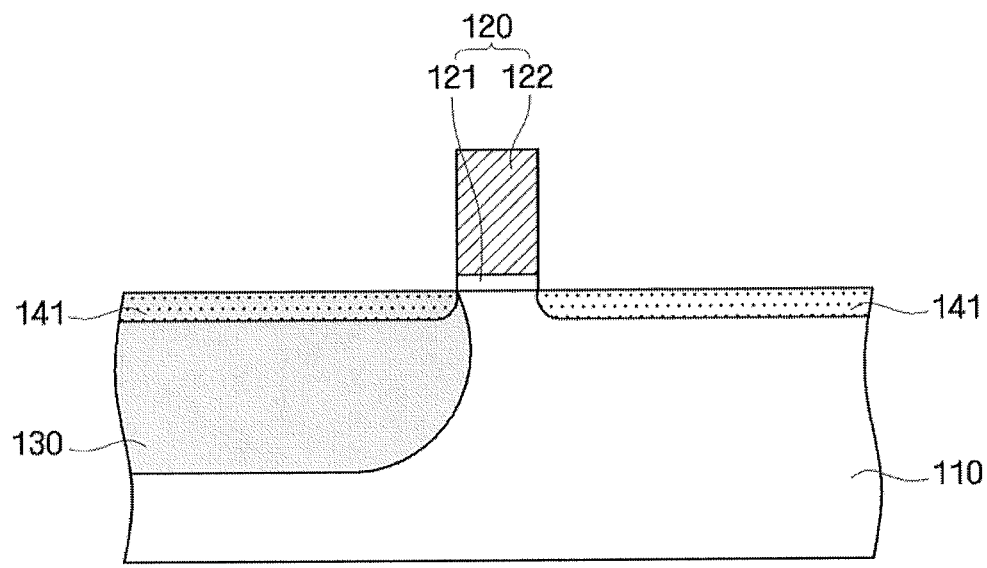

Referring to FIG. 3G, which shows the device after step S60, when a lightly doped drain (LDD) region 141 is formed by implanting impurities into the substrate 110 at opposing sides of the gate pattern 120.

In detail, the LDD region 141 is formed by performing an ion implantation process on the substrate 110 using the gate pattern 120 as a mask. In a case of an NMOS, an n-type dopant, such as phosphorus (P) or arsenic (As), may be used as the impurity, and in a case of a PMOS, a p-type dopant, such as boron (B) or gallium (Ga), may be used as the impurity.

The LDD region 141 reduces an electric field between the source region 142 and the drain region 143 and reduces leakage current. Formation of the LDD region 141 is optional; as the channel length is reduced, however, forming an LDD region is advantageous.

Figure 3H:
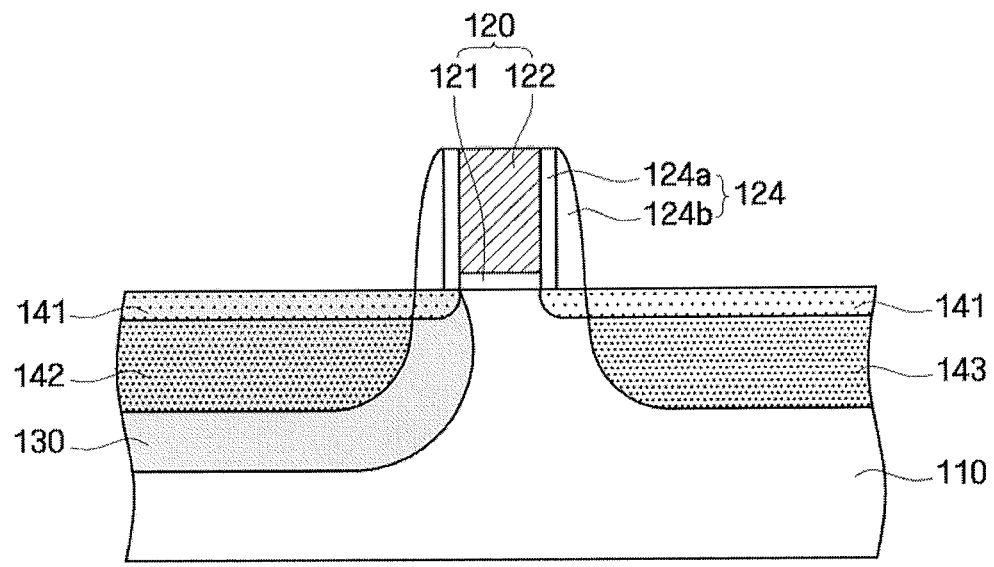

Referring to FIG. 3H, which shows the device after step S70, when the source region 142 and the drain region 143 are formed by implanting impurities into the substrate 110 at opposing sides of the gate pattern 120 and the gate spacer 124.

In detail, a first spacer-forming insulating layer and a second spacer-forming insulating layer are sequentially formed on sidewalls of the gate pattern 120 and etched, thereby forming the gate spacer 124 including a first spacer 124a and a second spacer 124b. Then, impurities are implanted into the entire surface of the substrate 110 by performing an ion implantation process using the gate pattern 120 and the gate spacer 124 as masks, thereby forming the source region 142 and the drain region 143. Here, the first spacer 124a may be formed of a silicon oxide layer and the second spacer 124b may be formed of a silicon nitride layer.

In particular embodiments, the source region 142 is formed in the recrystallized region 130 and the drain region 143 is formed in a non-recrystallized region spaced apart from and facing the source region 142 with respect to the gate pattern 120.

In step S30, an end-of-range (EOR) defect may be generated around the amorphous region 130a. The EOR defect may also be generated around the LDD region 141, providing the drain region 143 with further increased gate-induced drain leakage (GIDL). Thus, the drain region 143 may not be formed in the recrystallized region 130, thereby suppressing the leakage current from increasing. Meanwhile, the source region 142 plays an important role in enhancing the mobility of carriers. The source region 142 is formed in the recrystallized region 130, thereby increasing stress applied to the channel region.

As described above, according to the semiconductor device and the method for manufacturing the same, leakage current can be reduced and channel conductivity can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method for manufacturing a semiconductor device, comprising:
    forming a gate pattern on a substrate, wherein a channel region is formed under the gate pattern,
    forming a mask on a portion of the substrate at one side of the gate pattern, then
    forming an amorphous region by implanting impurities into an unmasked portion of the substrate, then
    removing the mask, and
    forming a recrystallized region by forming a stress liner on the substrate to cover the gate pattern and crystallizing the amorphous region, wherein the stress liner is formed of a material that applies compressive stress or tensile stress to the channel region.

2. The method of claim 1, wherein the impurities are implanted in a direction perpendicular to the substrate.

3. The method of claim 1, wherein the impurities are implanted at a predetermined angle with respect to the direction perpendicular to the substrate.

4. The method of claim 3, wherein the predetermined angle is in a range of 10 to 40 degrees.

5. The method of claim 3, wherein the impurities are implanted at a predetermined angle such that, when the semiconductor device is oriented with the gate pattern at the top of the device, the impurities extend under the gate pattern in the substrate.

6. The method of claim 5, wherein the mask includes a photoresist layer.

7. The method of claim 1, wherein the stress liner includes a silicon nitride layer.

8. The method of claim 1, further comprising forming a source region and a drain region by removing the stress liner and implanting impurities using the gate pattern as a mask.

9. The method of claim 8, wherein the source region is formed in the recrystallized region.

10. The method of claim 8, wherein the amorphous region is crystallized by annealing.

11. The method of claim 1, wherein a stacking fault defect is formed such that it becomes closer to the gate pattern in a horizontal direction at greater depths downwardly in the substrate, when the substrate is oriented with the gate pattern at the top, while the amorphous region is crystallized.

12. A method for manufacturing a semiconductor device, comprising:
    forming a gate pattern on a crystalline semiconductor substrate, wherein a channel region is formed under the gate pattern,
    forming an amorphous region in the semiconductor substrate at one side of the gate pattern while maintaining a crystalline region at an opposite side of the gate pattern,
    forming a stress liner on the semiconductor substrate and the gate pattern,
    forming a recrystallized region by crystallizing the amorphous region in the presence of the stress liner, and
    forming a source region in the recrystallized region, wherein the stress liner is formed of a material that applies compressive stress or tensile stress to the channel region.

13. The method of claim 12, wherein the amorphous region is formed by implanting impurities into the semiconductor substrate.

14. The method of claim 12, wherein a stacking fault defect is formed in the recrystallized region.

* * * * *